United States Patent
Yamauchi et al.

(10) Patent No.: US 7,042,769 B2
(45) Date of Patent: May 9, 2006

(54) SEMICONDUCTOR MEMORY DEVICE CAPABLE OF ACCURATE AND STABLE OPERATION

(75) Inventors: Tadaaki Yamauchi, Hyogo (JP); Kiyohiro Furutani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/938,615

(22) Filed: Sep. 13, 2004

(65) Prior Publication Data
US 2005/0058012 A1    Mar. 17, 2005

(30) Foreign Application Priority Data
Sep. 16, 2003   (JP) ............................ 2003-323130

(51) Int. Cl.
*G11C 7/00*   (2006.01)
*G11C 8/00*   (2006.01)

(52) U.S. Cl. .................. 365/189.01; 365/233
(58) Field of Classification Search ............... 365/233, 365/189.05, 194, 230.08, 189.01
See application file for complete search history.

(56) References Cited

U.S. PATENT DOCUMENTS 6,504,789 B1 *  1/2003  Hirakawa ................. 365/233
6,665,222 B1 * 12/2003  Wright et al. ............ 365/194
6,697,296 B1 *  2/2004  Matsumoto et al. ...... 365/233
6,757,214 B1 *  6/2004  Kawaguchi et al. ...... 365/194

FOREIGN PATENT DOCUMENTS

JP       9-311811      12/1997
JP    2002-304885      10/2002

* cited by examiner

*Primary Examiner*—Trong Phan
(74) *Attorney, Agent, or Firm*—McDermott Will & Emery LLP

(57)    ABSTRACT

An external clock generating circuit generates a mode indicating signal at the "H" level and generates an external clock signal synchronized with a write command buffer signal, when a semiconductor memory device is not in an internal operation mode. When the semiconductor memory device enters an internal operation mode and the mode indicating signal makes a transition from "H" to "L", the external clock signal is fixed at the "L" level. The external clock signal is not supplied to an external CUI, and the external CUI is set in a state in which reception of any external command is prohibited. Until the end of asynchronous reset, the mode indicating signal is kept at the "L" level, and thereafter raised to the "H" level, so that malfunction caused by an input of an external command during asynchronous reset period can be avoided.

6 Claims, 7 Drawing Sheets

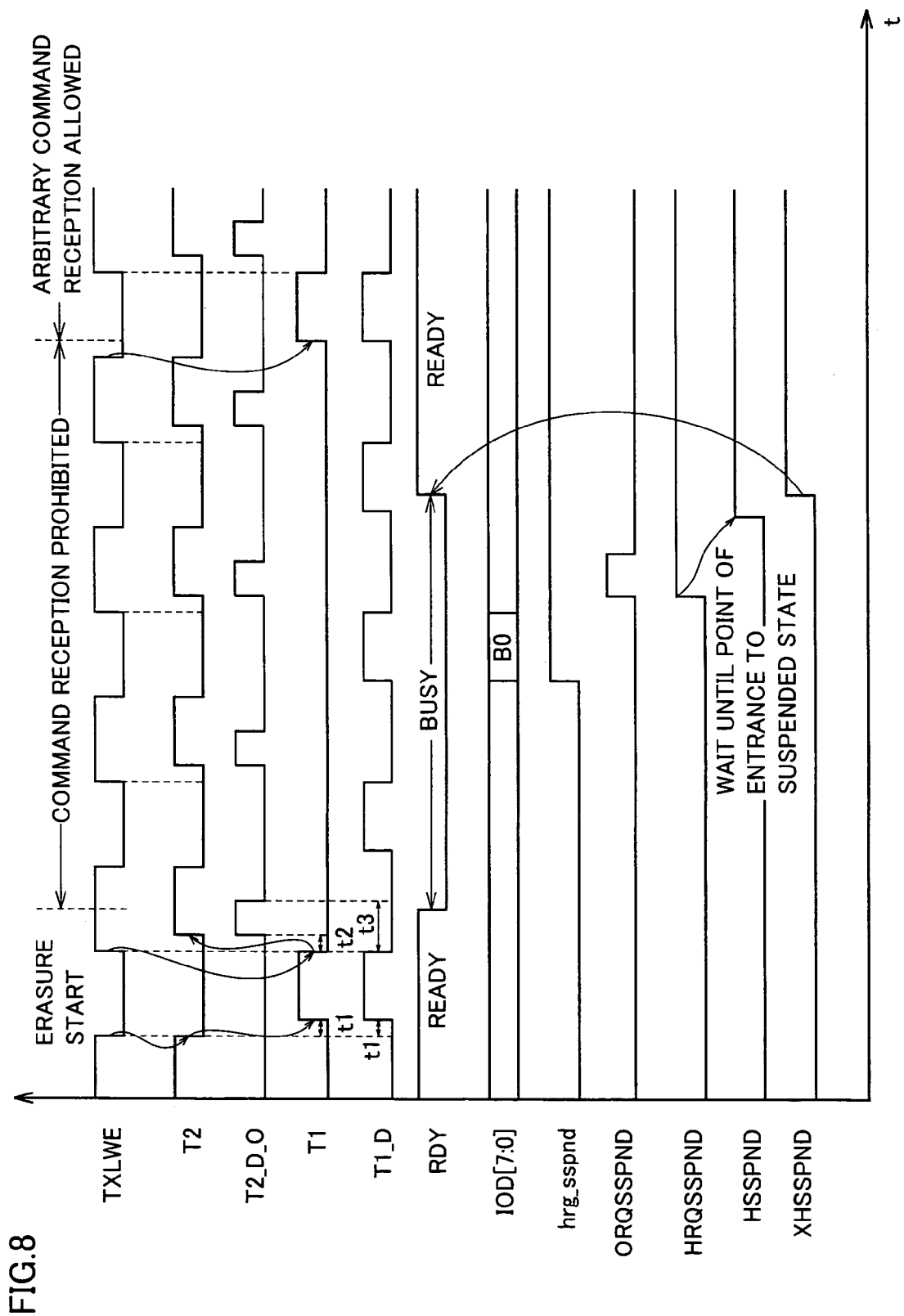

SEMICONDUCTOR MEMORY DEVICE CAPABLE OF ACCURATE AND STABLE OPERATION

BACKGROUND OF THE INVENTION

1. Field of the Invention

The present invention relates to a semiconductor memory device and, more specifically, it relates to a semiconductor memory device that takes in an external command in synchronization with an external clock signal and in synchronization with an internal clock signal, and makes a transition among a plurality of operation states corresponding to the taken external command.

2. Description of the Background Art

A semiconductor memory device receives various commands from the outside, generates various internal control signals in accordance with these commands, and controls internal circuitry in accordance with these internal control signals, so that internal operations including data writing and reading operations are executed.

Here, the semiconductor memory device takes in an external command in synchronization with an external clock signal of a prescribed period, and generates an external control signal in response to the taken external command, using an external control signal generating circuit provided therein. Further, when the external control signal is taken into an internal control signal generating circuit in synchronization with an internal clock signal, an internal control signal, for example, a signal for writing data to a memory cell array or for erasing data from the memory cell array, is generated in response. A control circuit operates the internal circuitry in response to the internal control signal.

In a semiconductor memory device, it takes a prescribed time period from the external command is received until a prescribed operation corresponding to the command is completed. Among the semiconductor memory devices, a flash memory, which is a non-volatile memory allowing electrical data writing and data reading, requires a longer time period for data writing, and therefore, the prescribed time period naturally becomes longer in the flash memory as compared with other semiconductor memory devices.

In view of the foregoing, in a semiconductor memory device, it is a general approach to receive as inputs external commands in synchronization with the external clock signal, and to perform internal operations in synchronization with the internal clock signal that is not synchronized with the external clock signal, generated by an internal oscillation circuit. In this approach, when an output of a circuit synchronized with the external clock signal is to be input to a circuit synchronized with the internal clock signal or vise-versa, the timing of receiving the external command and the timing of the internal operation must be adjusted not to be overlapped with each other, in order to avoid any malfunction.

By way of example, a malfunction may occur when an external command for executing a reading or writing operation clashes with an internal command for executing a refresh operation in a DRAM (Dynamic Random Access Memory), or when a data writing operation controlled by a CPU (Central Processing Unit) conflicts with a data reading operation controlled by a communication gate array in a single port RAM. Techniques for preventing data destruction or communication failure caused by such malfunctions are disclosed, for example, in Japanese Patent Laying-Open Nos. 2002-304885 and 09-311811. These techniques, however, address situations where a single clock signal is supplied, and not necessarily intended for the semiconductor memory device described above in which asynchronous two clock signals are supplied.

As described above, in the conventional semiconductor memory device to which two clock signals not synchronized with each other are supplied, it is indispensable to adjust timings of the external command and the internal control signal. Actually, however, an external command is input to an external control signal generating circuit even in the period of an internal operation.

By way of example, when the internal operation ends, a reset signal for initializing an internal latch circuit or the like is input from the internal control signal generating circuit to the external control signal generating circuit. If an external command is input in a period in which the external control signal generating circuit is reset in response to the reset signal in non-synchronized manner, a logical mismatch occurs in the external control signal generating circuit, possibly resulting in a malfunction.

Further, the external control signal generating circuit and the internal control signal generating circuit are respectively synchronized with clock signals that are asynchronous with each other, and therefore, when control signals are transferred between these circuits, a meta stable state, in which an output signal becomes unstable, may possibly occur in a sequential circuit such as a flip-flop contained therein. When a meta-stable state occurs, in the control signal generating circuits, the unstable state is propagated to a logic circuit and the like in succeeding stages, possibly hindering a normal operation.

SUMMARY OF THE INVENTION

An object of the present invention is to provide a semiconductor memory device capable of stably executing an accurate operation, without causing any possible malfunction among synchronous circuits to which clock signals not synchronized with each other are supplied.

According to an aspect, the present invention provides a semiconductor memory device, including: an external clock generating circuit generating an external clock signal in synchronization with a clock signal from outside the device; an external control signal generating circuit taking an external command applied from outside the device in synchronization with the external clock and generating an external control signal in response to the taken external command; a memory circuit including a memory cell array and a read/write circuit reading data from and writing data to the memory cell array; an internal control signal generating circuit taking the external control signal in synchronization with an internal clock signal asynchronous with the external clock signal, and generating an internal control signal controlling the memory circuit in response to the taken external control signal; a mode indicating signal generating unit generating a mode indicating signal that attains to a first logic state in response to the memory circuit entering an internal operation mode and to a second logic state in response to an end of the internal operation mode; and an internal clock generating circuit generating the internal clock signal in response to the mode indicating signal at the second logic state. The external clock signal generating circuit stops generation of the external clock signal in response to the mode indicating signal at the first logic state, and generates the external clock signal, based on a first signal generated based on the mode indicating signal at the second logic state and the clock signal from outside the device and on a second signal provided by delaying the clock signal from outside the device by a prescribed amount of delay.

According to this aspect, when the semiconductor memory device is in an internal operation mode, reception of an external command is prohibited until the internal operation ends and an asynchronous reset of the external control signal generating circuit ends, whereby any malfunction caused by logical mismatch experienced in the external control signal generating circuit can be avoided.

According to another aspect, in a semiconductor memory device, the possible meta stable state at the time of control signal transfer between the internal control circuit and the external control circuit that are not synchronized with each other can be avoided, malfunction can be suppressed and a stable operation becomes possible.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a timing chart illustrating the operation of the semiconductor memory device in accordance with the second embodiment.

DESCRIPTION OF THE PREFERRED EMBODIMENTS

Figure 1:
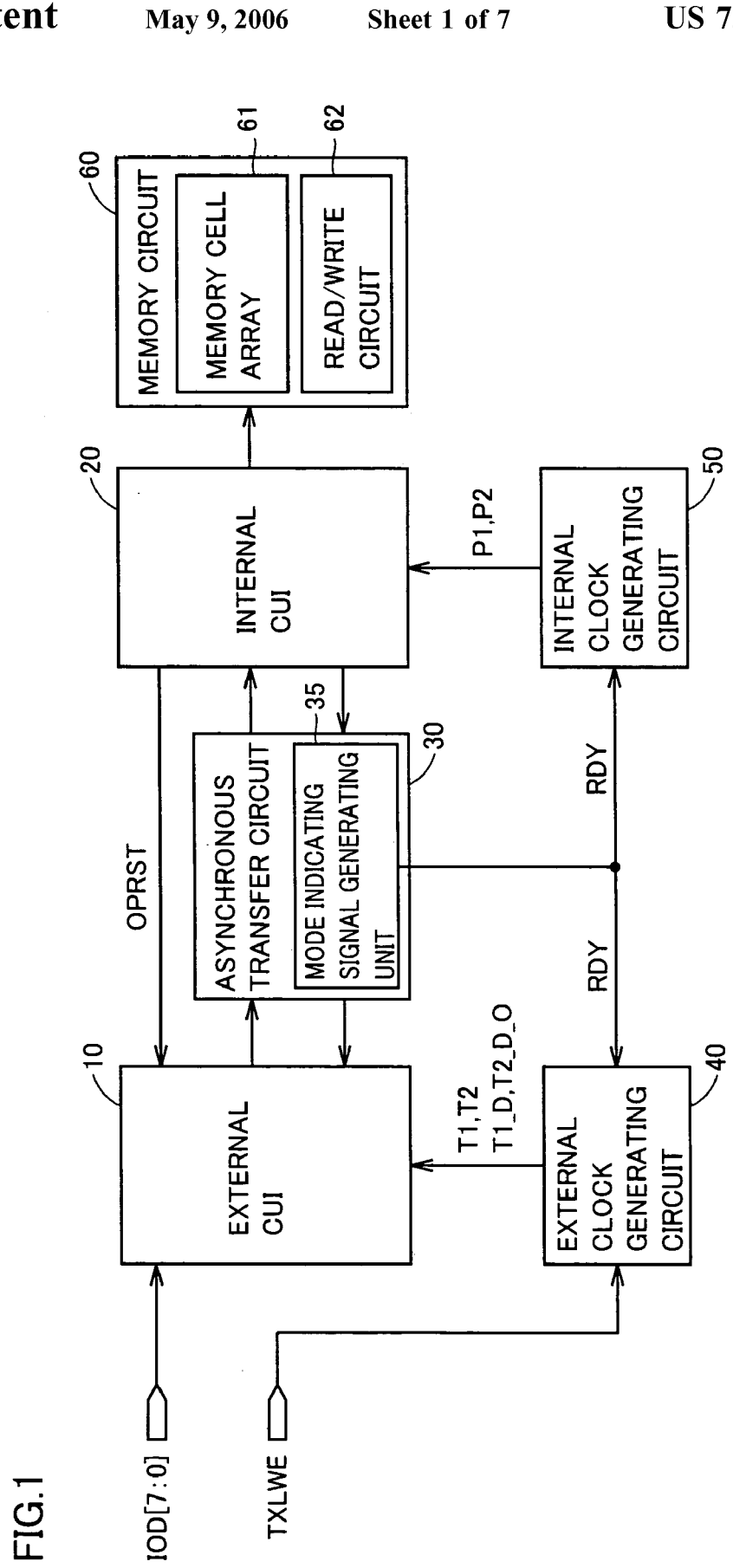
FIG. 1 is a block diagram representing a configuration of a semiconductor memory device in accordance with a first embodiment of the present invention.

In the following, embodiments of the present invention will be described in detail with reference to the figures. Throughout the figures, the same or corresponding portions are denoted by the same reference characters, and description thereof will not be repeated.

First Embodiment

FIG. 1 is a block diagram representing a configuration of a semiconductor memory device in accordance with a first embodiment of the present invention.

Referring to FIG. 1, the semiconductor memory device is a non-volatile memory taking in a plurality of external commands and making transitions among a plurality of operation states (data reading, data writing, data erasure and the like) in accordance with the taken external commands. In the following, a flash memory that allows electrical data writing and data reading will be described as a representative example of the non-volatile memory.

The flash memory includes an external clock generating circuit 40, an external command user interface (hereinafter also referred to as CUI) 10 taking an external command in synchronization with an external clock signal and generating an external control signal in response to the taken external command, an internal CUI 20 generating an internal control signal for controlling a memory circuit 60 in response to the external control signal, and an internal clock generating circuit 50.

External clock generating circuit 40 generates external clock signals T1, T2, T1_D and T2_D-O, using an externally applied write enable signal as a trigger. In the present embodiment, it is assumed that the clock signal is generated using a write command buffer signal TXLWE, which is a buffer signal of write enable signal, as a trigger. The generated external clock signal is transmitted to external CUI 10.

External CUI 10 is a synchronous circuit controlled in synchronization with the external clock signal, and it is also referred to as an external system circuit in the following. Though not shown, external CUI 10 includes a plurality of latch circuits latching external commands from an 8-bit input data IOD [7:0] in response to the external clock signal, and a plurality of combinatorial logic circuits generating an external control signal in response to the latched external commands. The external control signal functions as a signal controlling transition of operation states of the flash memory, and is generated inside the flash memory. The generated external control signal is transmitted to internal CUI 20.

Internal clock generating circuit 50 includes an oscillating circuit, not shown, such as a ring oscillator. In response to a mode indicating signal RDY indicating entry of the flash memory to an internal operation mode such as an erasing operation or a writing operation, the oscillating circuit operates and generates complementary internal clock signals P1 and P2.

In this manner, in the semiconductor memory device in accordance with the first embodiment, the external clock signal and the internal clock signal are signals generated independent from each other by different clock generating circuits, and the signals are asynchronous and have different phases from each other.

Internal CUI 20 is a synchronous circuit controlled in synchronization with the internal clock signal, and it is also referred to as an internal system circuit in the following. Internal CUI 20 includes a plurality of latch circuits respectively latching the external control signal in response to the internal clock signal, and a plurality of combinatorial logic circuits decoding the latched external control signal and generating an internal control signal in response to the decoded signal. The internal control signal functions as a signal controlling an internal operation in each operation state of the flash memory. The generated internal control signal is transmitted to memory circuit 60 and to external CUI 10.

Memory circuit 60 includes a memory cell array 61 of a plurality of flash memory type memory cells arranged in a matrix of rows and columns, and a read/write circuit 62 for reading and erasing data from memory cell array 61 and for writing data to the memory cell array.

Read/write circuit 62 includes a row decoder selectively activating a word line in response to a row address signal, a column decoder selectively activating a column selecting line in response to a column address signal, an input/output (I/O) circuit, a row address buffer, a column address buffer, and a pre-amplifier. The I/O circuit accesses, in response to the column selecting line activated by the column decoder, the corresponding bit line, and performs data input/output.

The internal control signal is a signal for controlling operations of erasing or reading data held in memory cell array 61 or memory circuit 60 or writing data to memory cell array 61. The internal control signal includes a row address latch signal for latching the row address signal in a row address buffer, a row address enable signal for activating the row decoder, a word line enable signal for activating the word line driver, and a column decoder enable signal for activating the column decoder.

As an example, the row address latch signal is applied to the row address buffer (not shown) of memory circuit 60. The row address buffer latches an externally applied row address signal in response to the row address latch signal.

As another example, the word line enable signal is applied to the row decoder (now shown) of memory circuit 60. The row decoder selectively activates the word line in response to the word line enable signal.

Here, external CUI 10 and internal CUI 20 are portions controlled in synchronization with clock signals that are not synchronized with each other. Therefore, when data is transferred between external CUI 10 and internal CUI 20, there is a problem of possible meta stable.

"Meta stable" refers to a state in which the output signal becomes unstable, as it is unknown at which time point the input signal changes, when an external, asynchronous signal is to be synchronized by a latch or a flip-flop. When the meta stable state occurs, the output signal comes to have a prescribed period of unstable state, which is propagated to logic circuits of the succeeding stage, preventing normal operation of the logic circuits. The meta stable state does not always occur and does not last long. It is, however, a cause of a malfunction.

Therefore, in the present embodiment, between external CUI 10 and internal CUI 20, an asynchronous transfer circuit 30 is arranged for adjusting data transfer timing. Though not shown, asynchronous transfer circuit 30 includes an internal system latch circuit latching the external control signal in response to the internal clock signal, an external system latch circuit latching the internal control signal in response to the external clock signal, and an asynchronous RS-type flip-flop.

In asynchronous transfer circuit 30, the external control signal and the internal control signal have their timings adjusted by the internal system and external system signals before transferred to the corresponding internal system circuit and external system circuit, respectively.

Asynchronous transfer circuit 30 further includes a mode indicating signal generating unit 35 outputting a mode indicating signal RDY indicating that the flash memory has entered an internal operation mode such as an erasure or programming operation, based on the external control signal and the internal control signal. Mode indicating signal RDY attains to an "H" level (="READY") in an idle state in which the flash memory has not entered any internal operation mode, and makes a transition to the "L" level (="BUSY") when the flash memory enters an internal operation mode. Mode indicating signal RDY is transmitted to external clock generating circuit 40 and internal clock generating circuit 50, as shown in FIG. 1.

Figure 2:
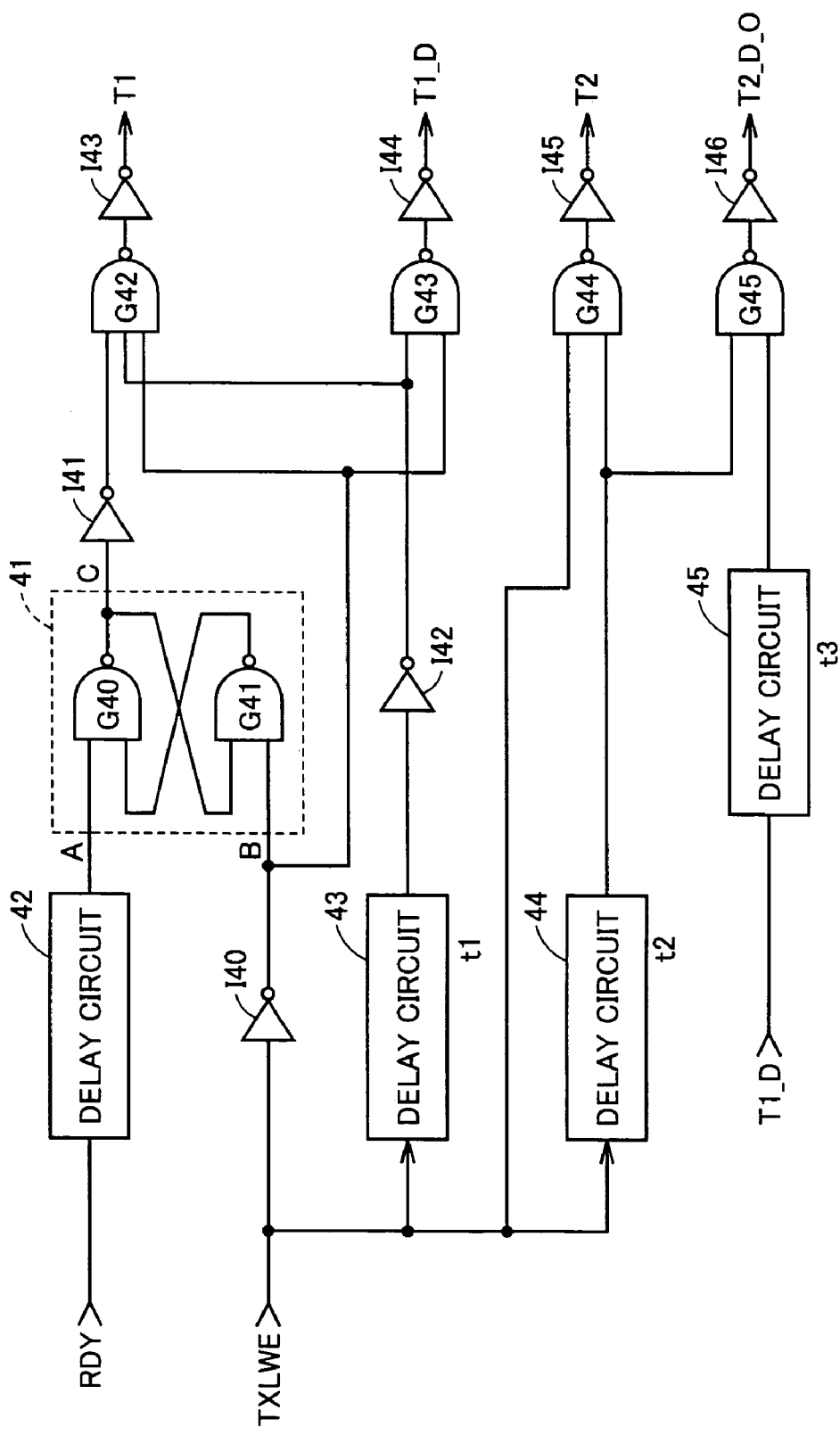
FIG. 2 is a circuit diagram representing an external clock generating circuit 40 shown in FIG. 1.

FIG. 2 is a circuit diagram representing external clock generating circuit 40 shown in FIG. 1. External clock generating circuit 40 is a portion generating the external clock signal using as a trigger a write command buffer signal TXLWE generated in response to write enable signal WE, which is an external command.

Referring to FIG. 2, external clock generating circuit 40 includes a phase comparator 41 comparing phases of mode indicating signal RDY and write command buffer signal TXLWE, delay circuits 42 to 45, NAND circuits G42 to G45, and inverters I40 to I46.

Phase comparator 41 includes an RS-type flip-flop including NAND circuits G40 and G41. The RS-type flip-flop receives, at a set input node, the mode indicating signal RDY through delay circuit 42, and receives, at a reset input node, an inverted signal of the write command buffer signal TXLWE through inverter I40. The RS-type flip-flop compares whether the phases of these two signals match or not, and outputs a comparison result signal to a set output node. The set output of the RS-type flip-flop, that is, the comparison result signal of phase comparator 41, is inverted by inverter I41 and input to the first input node of NAND circuit G42.

In the phase comparison between the mode indicating signal RDY and the inverted signal of write command buffer signal TXLWE, when the mode indicating signal RDY is at "H", that is, when the semiconductor memory device has not yet entered any internal operation mode and is "READY", phase comparator 41 outputs a phase comparison result signal at the "L" level. Therefore, a phase comparison result signal inverted to the "H" level is input to NAND circuit G42.

When the mode indicating signal RDY is "L", that is, when the flash memory has entered an internal operation mode and is "BUSY", phase comparator 41 outputs the phase comparison result signal at the "H" level. Therefore, a phase comparison result signal inverted to the "L" level is input to NAND circuit G42.

Write command buffer signal TXLWE is inverted by inverter I40 and input to a third input node of NAND circuit G42 and to a second input node of NAND circuit G43.

Further, write command buffer signal TXLWE is delayed by a prescribed delay amount (hereinafter denoted by t1) by delay circuit 43, inverted by inverter I42, and then input to the second input node of NAND circuit G42 and to the first input node of NAND circuit G43.

When the inverted signal of the comparison result signal from phase comparator 41 is at the "H" level (corresponding to the "READY" state), NAND circuit G42 provides a logical product between the inverted signal of write command buffer signal TXLWE and the inverted signal of write command buffer signal TXLWE delayed by the delay amount t1, and generates, as the result of operation, an external clock signal T1. The generated external clock signal T1 is an inverted signal of write command buffer signal TXLWE, which rises from "L" to "H" after a delay of t1 from the time point of fall of the write command buffer signal TXLWE from "H" to "L".

When the inverted signal of the comparison result signal is at the "L" level (corresponding to the "BUSY" state), the external clock signal T1 output from NAND circuit G42 is fixed at the "L" level.

NAND circuit G43 provides a logical product between the inverted signal of write command buffer signal TXLWE and the inverted signal of write command buffer signal TXLWE delayed by the amount t1, and generates, as the result of operation, an external clock signal T1_D. The generated external clock signal T1_D is an inverted signal of write command buffer signal TXLWE, which rises from "L" to "H" after a delay of t1 from the time point of fall of the write command buffer signal TXLWE from "H" to "L".

The write command buffer signal TXLWE is further input to the first input node of NAND circuit G44. To the second node of NAND circuit G44, the write command buffer signal TXLWE delayed by a prescribed amount of delay (hereinafter denoted by t2) by delay circuit 44 is input. NAND circuit G44 outputs, as a result of operation providing a logical product of these two signals, an external clock signal T2. External clock signal T2 is synchronized with the write command buffer signal TXLWE, and rises from "L" to "H" after a delay of t2 determined by delay circuit G44 from the time point of rise of the write command buffer signal TXLWE from "L" to "H".

The write command buffer signal TXLWE delayed by the delay amount t2 by delay circuit 44 and the external clock signal T1_D delayed by a prescribed amount of delay (hereinafter denoted by t3) by delay circuit 45 are input to NAND circuit G45. NAND circuit G45 outputs, as a result of logical product operation between these two signals, a one-shot pulse external clock signal T2_D_O having a pulse width corresponding to the difference between the delay amount t3 and the delay amount t2, i.e. t3–t2.

Among the external clock signals generated by external clock generating circuit 40 having the above described configuration, generation of only the external clock signal T1 is controlled by the result of phase comparison between the mode indicating signal RDY and the write command buffer signal TXLWE. Phase comparator 41 is formed of an RS-type flip-flop as shown in FIG. 2, and therefore the state of operation thereof changes dependent on the input timing of the two signals. Specifically, let us denote the two input terminals of RS-type flip-flop 41 by A and B and the output terminal by C, as shown in FIG. 2. When the input level at input terminal A makes a transition from "L" to "H" while the input level at input terminal B is at "L", the output level of output terminal C attains to the reset state of "L" level in response.

Here, if signals at the "H" level are input to two input terminals A and B, the RS-type flip-flop cannot determine whether the output of output terminal C attains to the reset state of "L" level or hold state of "H" level, and therefore, it enters a meta stable state in which the output signal is unstable. Though meta stable state lasts relatively short, it possibly makes the external clock signal T1 unstable.

In order to avoid the meta stable state, in the present embodiment, a delay circuit 43 is provided for adjusting the timing of output of external clock signal T1 from NAND circuit G42, so that there is a delay of t1 from the fall of the write command buffer signal TXLWE and the rise of external clock signal T1, as shown in FIG. 2. The delay amount t1 is set to be longer than the period in which the meta stable state occurs in phase comparator 41. Specific amount of delay t1 is about 5 to 10 [ns], which is at least ten times the gate delay time of NAND circuits G40 and G41.

In this manner, the timing of activating the external clock signal T1 (here, the timing of rise of the clock) is determined by the signal (hereinafter referred to as a second signal) delayed by a prescribed time period from the signal (hereinafter referred to as a first signal) generated by the mode indicating signal RDY and the write command buffer signal TXLWE. The prescribed time period corresponds to the delay amount t1 minus delay amount experienced in phase comparator 41. As a result, NAND circuit G42 is opened after the phase comparison result signal of phase comparator 41 has exited the meta stable state and has returned to the stable state.

Next, prohibition of receiving external command while external CUI 10 is in an asynchronous reset period will be described.

Again referring to FIG. 1, when external CUI 10 receives the write command buffer signal TXLWE and outputs an external control signal, and the external control signal is transmitted to internal CUI 20 through asynchronous transfer circuit 30, the flash memory enters an internal operation mode. At this time, the mode indicating signal RDY output from mode indicating signal generating unit 35 makes a transition from the "H" level indicating the "READY" state to the "L" level indicating the "BUSY" state. Internal clock generating circuit 50 generates internal clock signals P1 and P2 using the "L" level mode indicating signal RDY as a trigger.

After entering the internal operation mode, internal CUI 20 performs an internal operation in synchronization with internal clock signals P1 and P2. Further, when a prescribed operation ends, internal CUI 20 outputs a reset signal OPRST for initializing the latch circuit arranged in external CUI 10. Reset signal OPRST is kept activated ("H" level) for a prescribed time period immediately before the flash memory makes a transition from the "BUSY" state to the "READY" state.

External CUI 10 asynchronously resets the internal latch circuit in response to the activated reset signal OPRST. Consequently, external CUI 10 returns to the idle state.

In the latch circuit arranged in external CUI 10, if an external command should be input in the asynchronous reset period, there would be asynchronous reset under synchronous control, which causes a problem. In order to avoid such a situation, it is necessary to prohibit reception of any external command in the asynchronous reset period.

Therefore, in the present embodiment, command input of external CUI 10 is controlled using the mode indicating signal RDY indicating whether the flash memory is in the internal operation mode or not. After the end of asynchronous reset, the mode indicating signal RDY is changed from "L" to "H" in response to inactivation ("L" level) of the reset signal OPRST.

When input to external clock generating circuit 40, the mode indicating signal RDY has its phase compared to that of write command buffer signal TXLWE as shown in FIG. 2, to control generation of external clock signal T1. When the mode indicating signal RDY is at the "H" level, external clock generating circuit 40 generates the external clock signal T1 synchronized with the write command buffer signal TXLWE.

External clock signal T1 is fixed at the "L" level in response to the transition of mode indicating signal RDY from "H" level to "L" level. Specifically, when the flash memory enters the internal operation mode and is in a "BUSY" state, the external clock signal T1 is not generated even when the write command buffer signal TXLWE is toggled. As the external clock signal T1 is not supplied, external CUI 10 enters a state in which reception of any external command is prohibited.

Therefore, in order to prevent any malfunction caused by an input of an external command in the asynchronous reset period described above, the mode indicating signal RDY must be kept at the "L" level until the asynchronous reset ends, and after the end of the asynchronous reset, the signal RDY may be set to the "H" level. When the mode indicating signal RDY is at the "L" level, generation of the external clock signal T1 is suppressed, and therefore, reception of an external command can be prohibited.

For this purpose, delay circuit 42 is provided for inputting the mode indicating signal RDY to input terminal A of phase comparator 41 with a delay. Thus, with a prescribed delay amount of delay circuit 42 after the mode indicating signal RDY attains to the "H" level, external clock generating circuit 40 generates external clock signal T1 again. Specifically, delay circuit 42 is provided to generate external clock signal T1 after the operation of external CUI 10 is fully completed, after the transition of the mode indicating signal RDY from the "L" level to the "H" level.

Here, delay circuit 42 delays the rise of mode indicating signal RDY than the fall, and the rise delay may be about ⅙ of the pulse width of reset signal OPRST. Specifically, the pulse width of the reset signal OPRST is 30 [ns] and the delay is about 1 to 5 [ns]. In order to avoid meta stable of phase comparator 41, the amount of delay of delay circuit 42 must be smaller than the delay amount of delay circuit 43.

Next, the relation between each of the signals and the reception of external command will be described. External clock signal generating circuit 40 starts generation of external clock signal T1 by raising external clock signal T1 from the "L" level to the "H" level, in response to the fall of the write command buffer signal TXLWE from the "H" level to the "L" level when the mode indicating signal RDY is at the "H" level. When the generated external clock signal T1 is input to the external CUI 10, external CUI 10 is allowed to receive any external command.

Figure 3:
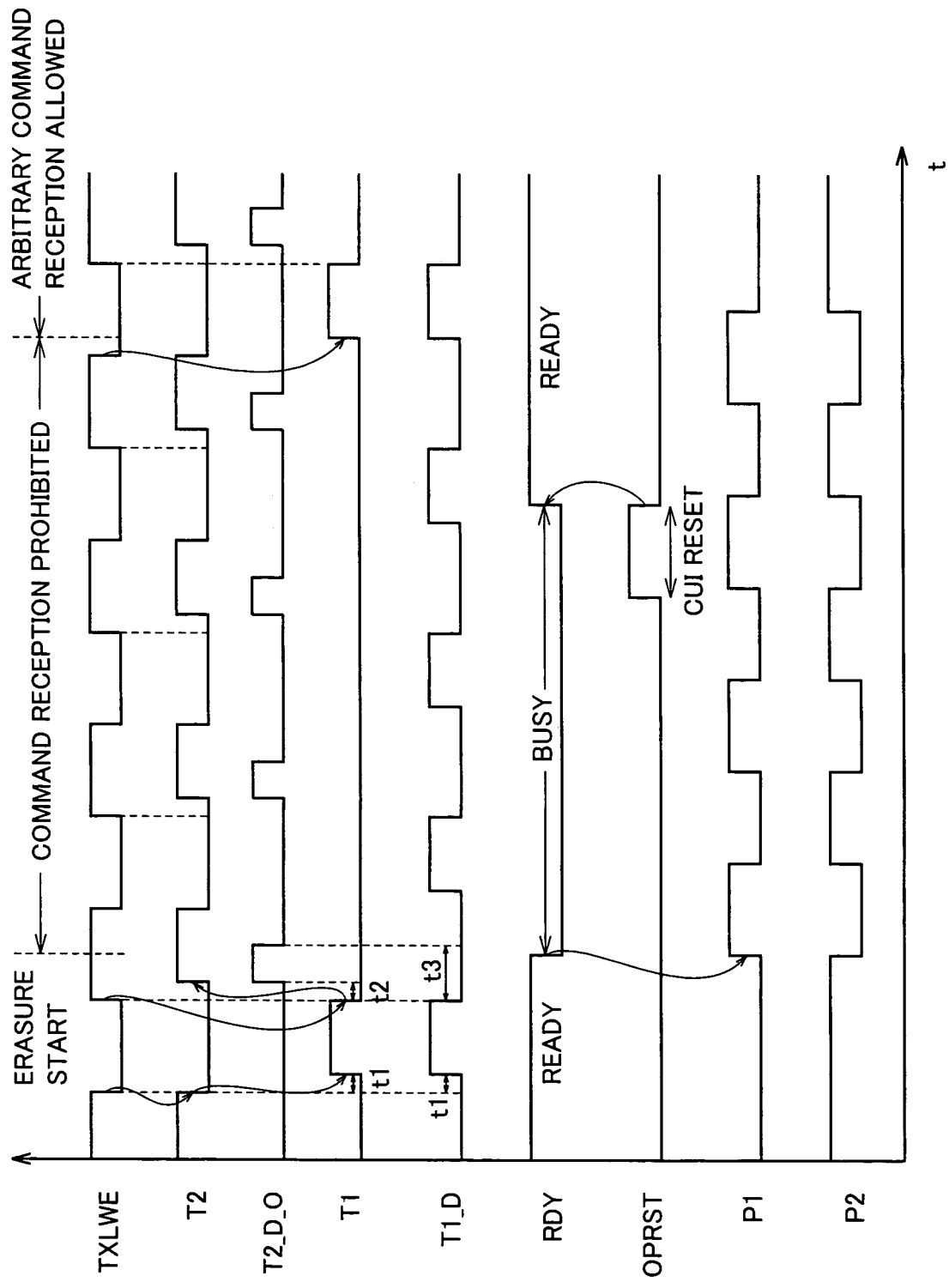
FIG. 3 is a timing chart illustrating the operation of the semiconductor memory device shown in FIG. 1.

FIG. 3 is a timing chart illustrating an operation of the semiconductor memory device shown in FIG. 1.

Referring to FIG. 3, a command for executing a prescribed operation is input to external CUI 10. In the following, it is assumed that the write command buffer signal TXLWE is input for a data erasure operation. The write command buffer signal TLXWE is also input to external clock generating circuit 40.

To the external clock generating circuit 40, the mode indicating signal RDY at the "H" level indicating that the flash memory is "READY" is input. Based on the phase comparison between the mode indicating signal RDY and the write command buffer signal TXLWE, external clock generating signal 40 generates the external clock signal T1, as shown in FIG. 2. When the mode indicating signal RDY is at "H", external clock signal T1 is a signal synchronized with the write command buffer signal TXLWE. To avoid meta stable occurring in phase comparator 41 in external clock generating-circuit 40, external clock signal T1 rises from the "L" level to the "H" level at a timing delayed by t1 from the fall of write command buffer signal TXLWE.

In addition to external clock T1, external clock generating circuit 40 generates external clock signals T2 and T1_D that operate independent from the mode indicating signal RDY, as shown in FIG. 3, and a one-shot pulse external clock signal T2_D_O (not shown).

External CUI 10 latches, in a latch circuit provided therein, the write command buffer signal TXLWE, in response to the external clock signal T1, and in a combinatory logic circuit, generates an external control signal in response to the latched signal.

When the external control signal is transmitted to internal CUI 20 through asynchronous transfer circuit 30, the flash memory enters the internal operation mode. At this time, the mode indicating signal RDY output from mode indicating signal generating unit 35 makes a transition from the "H" level indicating the "READY" state to the "L" level indicating the "BUSY" state.

Internal clock generating circuit 50 generates complementary clock signals P1 and P2, using the mode indicating signal RDY at the "L" level as a trigger. Internal CUI 20 generates an internal control signal in response to the external control signal, in synchronization with the internal clock signals P1 and P2. In memory circuit 60, an internal operation such as data erasure or programming is performed in accordance with the internal control signal.

In external clock generating circuit 40, external clock signal T1 is fixed at the "L" level in response to the transition of the mode indicating signal RDY from the "H" level to the "L" level. Consequently, external CUI 10 is prohibited to receive any external command.

Next, after a series of erasing operations ends and immediately before the flash memory makes a transition from "BUSY" to "READY", internal CUI 20 outputs a reset signal OPRST for returning external CUI 10 to the idle state. The latch circuit of external CUI 10 is asynchronously reset, in response to the reset signal OPRST.

Finally, in response to the end of asynchronous reset in external CUI 10, mode indicating signal RDY rises from the "L" level to the "H" level.

External clock generating circuit 40 again generates the external clock signal T1 in response to the fall of write command buffer signal TXLWE, when the mode indicating signal RDY is at "H". Consequently, external CUI 10 is allowed to receive an external command again.

As described above, according to the first embodiment of the present invention, when the semiconductor memory device is in the internal operation mode, reception of any external command is prohibited until the internal operation ends and asynchronous reset of the external control signal generating circuit is complete. Therefore, a malfunction caused by a logic mismatch generated in the external control signal generating circuit can be avoided.

Further, in the external clock generating circuit, a delay circuit having such a delay amount that corresponds to the period in which the phase comparator is in a meta stable state is arranged, and therefore, a stable external clock signal can be transmitted.

Second Embodiment

In the first embodiment, a configuration has been described in which, when the semiconductor memory device is in the internal operation mode, reception of any external command is prohibited until the internal operation ends and the asynchronous reset of the external control signal generating circuit is complete, so as to prevent any malfunction in the external control signal generating circuit.

It necessary, however, to allow only the input of a suspend command among various externally applied commands, to have the semiconductor memory device held in a suspended state, even in the internal operation mode.

Therefore, in the present embodiment, a configuration will be described in which a suspend command receiving function is additionally provided to the semiconductor memory device in accordance with the first embodiment.

Figure 4:
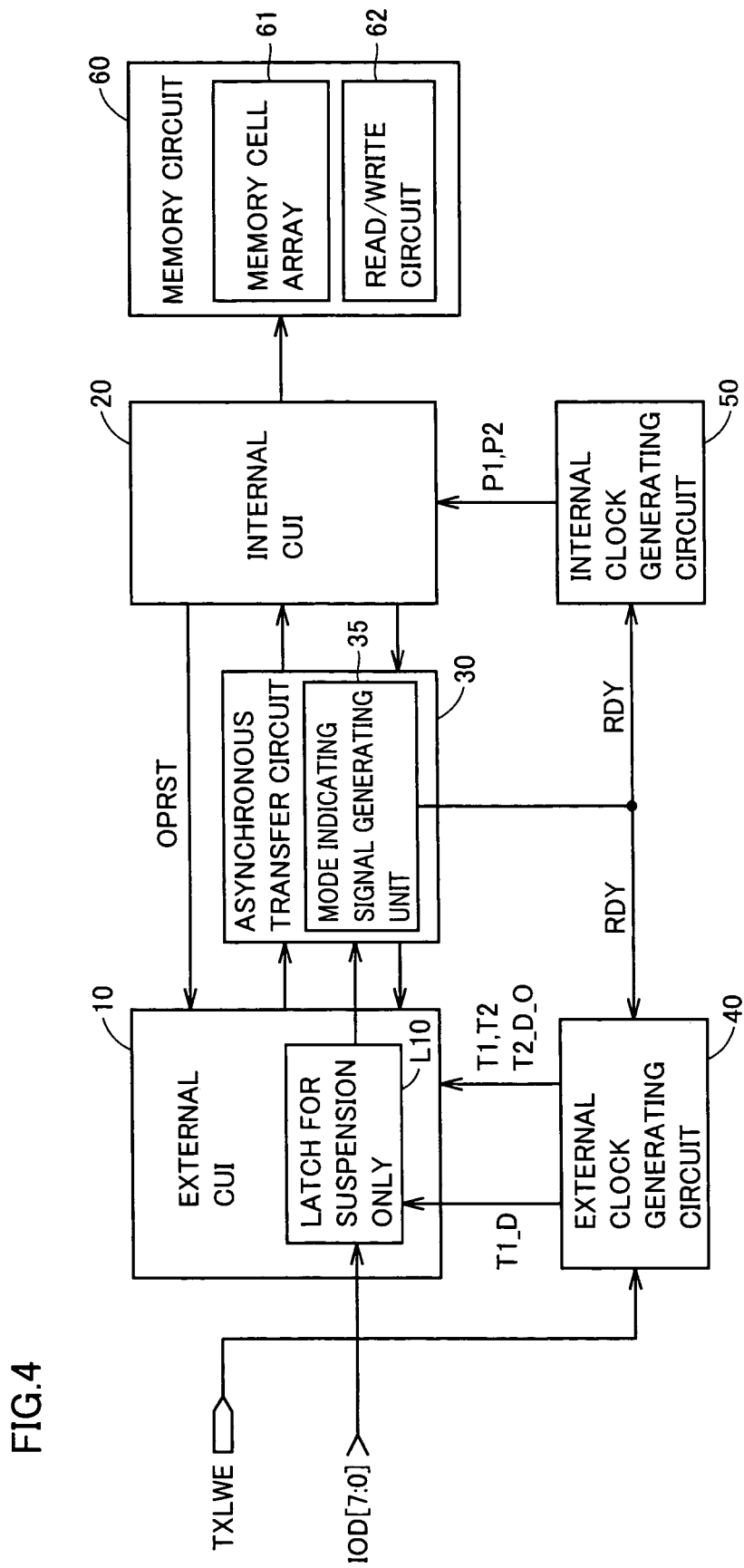
FIG. 4 is a block diagram representing a configuration of a semiconductor memory device in accordance with a second embodiment of the present invention.

FIG. 4 is a block diagram representing a configuration of a semiconductor memory device in accordance with the second embodiment of the present invention. In this embodiment also, as in the first embodiment, a flash memory will be described as an example of the semiconductor memory device.

Referring to FIG. 4, the flash memory includes external clock generating circuit 40, external CUI 10 generating an external control signal in synchronization with an external clock signal, internal CUI 20 generating an internal control signal for controlling memory circuit 60 in response to the external control signal, internal clock generating circuit 50, and asynchronous transfer circuit 30. These components are common to those of the flash memory of the first embodiment shown in FIG. 1, and therefore, detailed description thereof will not be repeated.

The flash memory further includes, in external CUI 10, a latch circuit L10 for suspension only, for receiving the suspend command. The suspend command is given by an 8-bit input data IOD [7:0], as shown in FIG. 4.

Latch circuit L10 for suspension only latches the suspend command, in a similar manner as other latch circuits arranged in external CUI 10, in response to an external clock signal supplied from external clock generating circuit 40.

Among the external clock signals generated by external clock generating circuit 40, the external clock signal T1 is fixed at the "L" level in response to a transition of the mode indicating signal RDY from "H" (corresponding to the "READY" state) to "L" (corresponding to the "BUSY" state), as described above. Consequently, external CUI 10 is prohibited from receiving any external command.

In contrast, the external clock signal T1_D is supplied to latch circuit L10 for suspension only. As described with reference to FIG. 2, external clock signal T1_D is a clock signal that operates independent from mode indicating signal RDY. Therefore, latch circuit L10 for suspension only can always receive the suspend command in response to the external clock signal T1_D having a prescribed period, regardless of the operation mode of the flash memory.

The suspend command received while the flash memory is "BUSY" is latched by latch circuit L10 for suspension only, and transmitted to a combinatorial logic circuit, not shown. The combinatorial logic circuit generates an external control signal in response to the latched suspend command, and transmits the same to internal CUI 20.

Here, the external control signal is in synchronization with the external clock signal T1_D, and therefore, when it is to be input to the asynchronous internal CUI 20, the signal must be converted by asynchronous transfer circuit 30 to be a signal synchronized with the internal clock signal.

Figure 5:
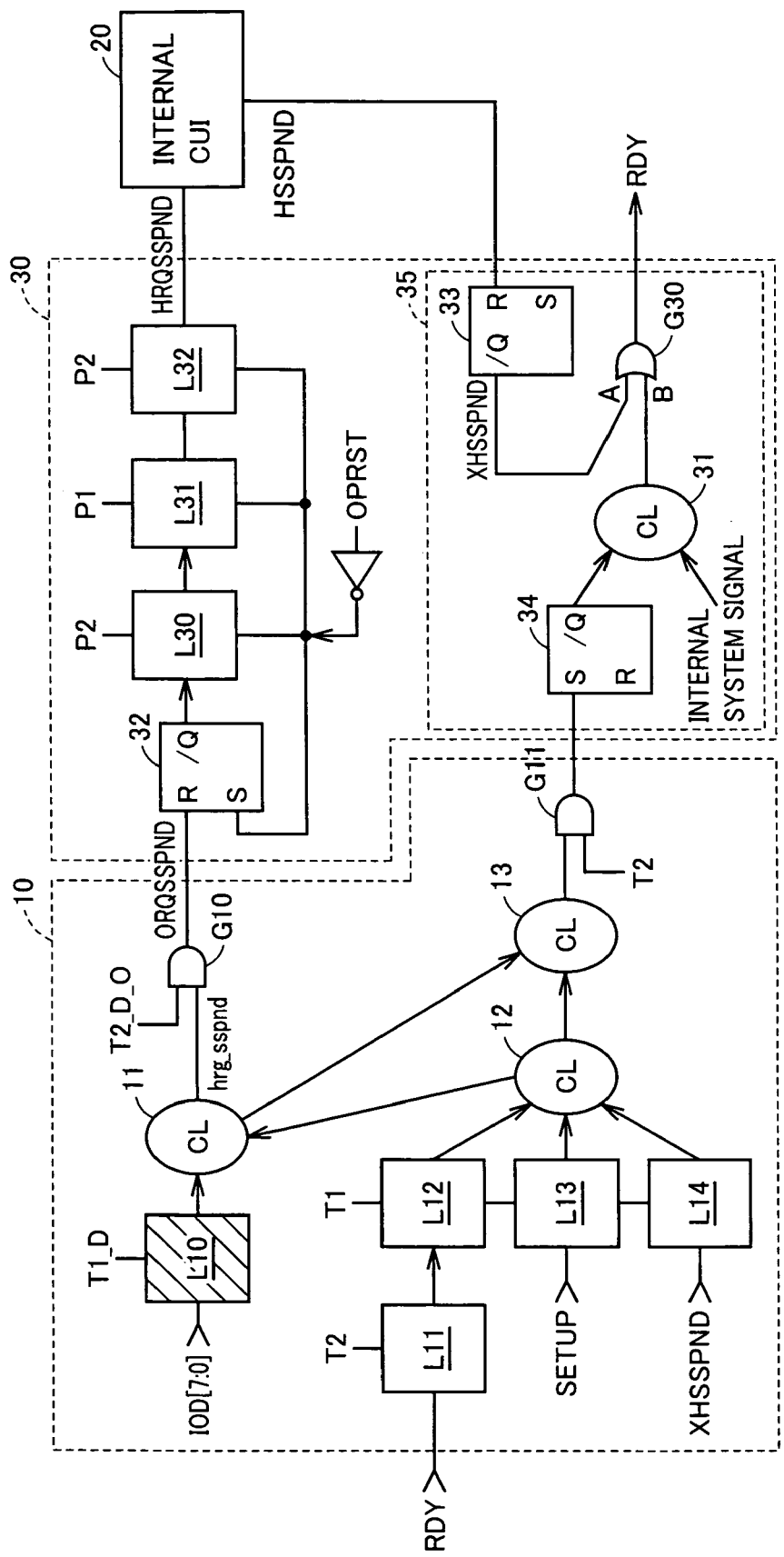
FIG. 5 is a circuit diagram illustrating an asynchronous data transfer between an external CUI (Command User Interface) 10 and an internal CUI 20 in the semiconductor memory device shown in FIG. 4.

FIG. 5 is a circuit diagram illustrating asynchronous data transfer between external CUI 10 and internal CUI 20 in the flash memory shown in FIG. 4.

Referring to FIG. 5, external CUI 10 includes latch circuits L11 to L14 latching various input commands in response to external clock signals T1 and T2, combinatory logic circuits (CL) 12 and 13 generating an external control signal in response to the latched plurality of commands, and an AND circuit G11 outputting the external control signal in synchronization with the external clock signal T2. Commands applied to latch circuits L11 to L14 include, in addition to the mode indicating signal RDY, a set-up command SETUP and an internal control signal XHSSPND generated in response to the suspend command in internal CUI 20.

External CUI 10 further includes latch circuit L10 for suspension only, for latching the suspend command in response to external clock signal T1_D, a combinatorial logic circuit (CL) 11 generating an external control signal in response to the latched suspend command, and an AND circuit G10 outputting the external control signal in synchronization with the one-shot pulse external clock signal T2_D_O.

Latch circuit L10 for suspension only latches the suspend command in response to external clock signal T1_D, and inputs the latched command to combinatorial logic (CL) circuit 11. Combinatorial logic (CL) circuit 11 decodes the suspend command, and generates a signal hrq_sspnd. When the signal hrq_sspnd is input, AND circuit 10 outputs a one-shot pulse external control signal ORQSSPND, in response to external clock signal T2_D_O.

Asynchronous transfer circuit 30 includes an asynchronous RS-type flip-flop 32, and latch circuits L30 to L32 latching the external control signal in response to internal clock signals P1 and P2.

External control signal ORQSSPND instructing a suspension is output from AND circuit G10 of external CUI 10, passed to asynchronous RS-type flip-flop 32 of asynchronous transfer circuit 30 and latched by three stages of latch circuits L30 to L32 connected in series. The configuration of latch circuits will be described in detail later. The latched external control signal ORQSSPND is converted to an internal system signal HRQSSPND synchronized with internal clock signals P1 and P2, and transmitted to internal CUI 20. Internal CUI 20 suspends the operation of memory circuit 60, not shown, in response to the suspend command given as the internal system signal HRQSSPND. At this time, in response to memory circuit 60 entering the suspended state, internal CUI 20 generates an activated internal control signal HSSPND. Further, these latch circuits L30 to L32 are reset in response to activation of the reset signal OPRST.

Asynchronous transfer circuit 30 further includes, as a mode indicating signal generating unit 35, an asynchronous RS-type flip-flop 33 receiving the internal control signal, an asynchronous RS-type flip-flop 34 receiving the external control signal, a combinatorial logic (CL) circuit 31, and an OR circuit G30.

When the semiconductor memory device is in the internal operation mode, input terminals A and B of OR circuit 30 both attain to the "L" level, and the mode indicating signal RDY at the "L" level is output. Further, after an end of a normal internal operation (except for an end caused by suspension), the input terminal B attains to the "H" level and the mode indicating signal RDY makes a transition to the "H" level.

RS-type flip-flop 33 receives the internal control signal HSSPND and generates the signal XHSSPND. RS-type flip-flop 34 receives the external control signal and transmits the same to combinatorial logic (CL) circuit 31. Combinatorial logic (CL) circuit 31 generates a signal in response to the combination of the external control signal and an internal system signal. A logical sum of signal XHSSPND and the output signal of combinatorial logic (CL) circuit 31 is calculated by OR circuit G30, and as a result of this calculation, mode indicating signal RDY is output.

Figure 6:
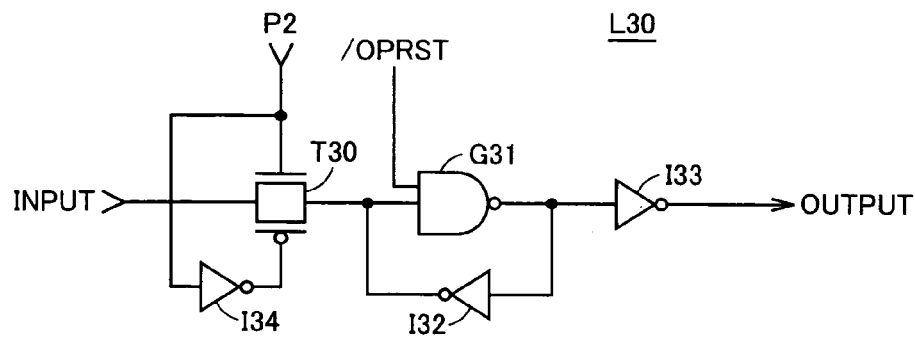
FIG. 6 is a circuit diagram representing a configuration of a latch circuit L30 arranged in the asynchronous transfer circuit shown in FIG. 5.

FIG. 6 is a circuit diagram representing a configuration of latch circuit L30 arranged in the asynchronous transfer circuit shown in FIG. 5. Latch circuits L30, L31 and L32 all have the same configuration, and therefore, only the latch circuit L30 will be described as a representative.

Referring to FIG. 6, latch circuit L30 includes a transfer gate T30, an NAND circuit G31 and inverters I32 to I34.

Transfer gate T30 turns on in response to the internal clock signal P2 at the "H" level, and takes in an input signal. NAND circuit 31 and inverter I32 form a latch portion, as an input of one is coupled to an output of the other when the inverted signal/OPRST of the reset signal OPRST is at "H", and hold the taken signal. Inverter I33 outputs the held signal.

In the latch circuit L30 having the configuration shown in FIG. 6, when the internal clock signal P2 is at the "H" level, transfer gate T30 turns on so that the input signal is taken, and when the internal clock signal P2 is at the "L" level, it turns off so that the taken signal is held in the latch portion.

In this manner, latch circuit L30 performs the latch operation in synchronization with the internal clock signal P2. As shown in FIG. 5, to latch circuit L30, an asynchronous external control signal, transferred from external CUI 10, is input. At this time, as the external control signal is out of the input timing definition, the meta stable state may occur in latch circuit L30.

Figure 7:
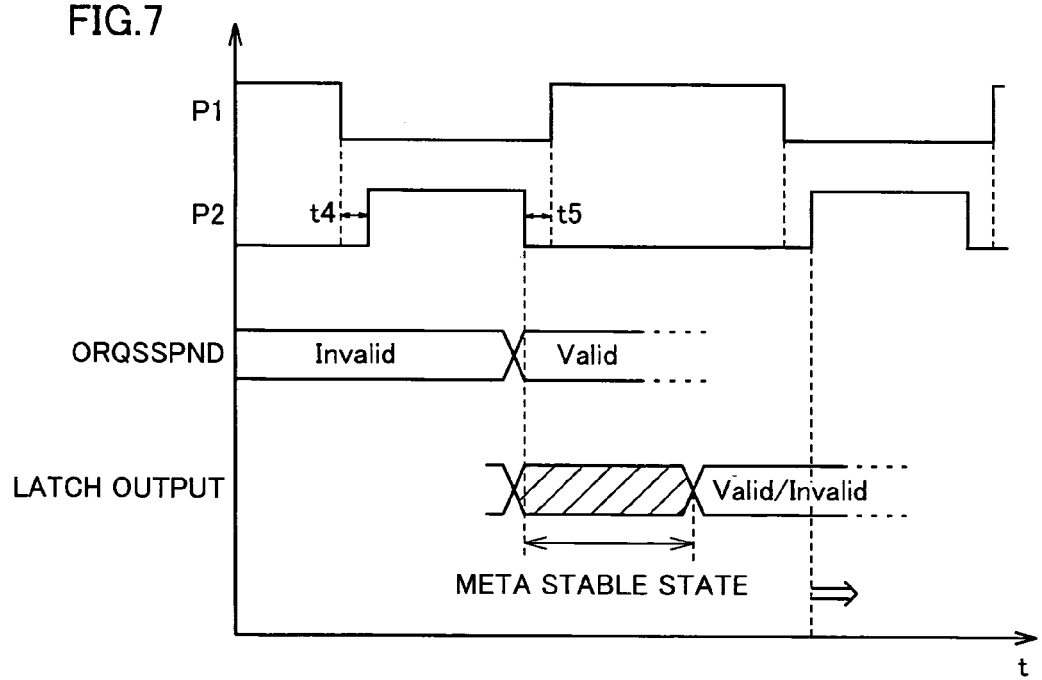
FIG. 7 is a timing chart illustrating a meta stable state possible in latch circuit L30 shown in FIG. 6.

FIG. 7 is a timing chart illustrating the meta stable state possible in latch circuit L30 shown in FIG. 6. In the following, it is assumed that an external control signal ORQSSPND generated from the suspend command is input to latch circuit L30 as the external control signal.

External control signal ORQSSPND makes transitions between "Valid" and "Invalid", as shown in FIG. 7. In latch circuit L30, internal clock signal P2 falls from "H" to "L", and holds a value immediately before turning-off of the transfer gate T30.

If the timing of fall of internal clock signal P2 should match the timing of transition of the external control signal ORQSSPND from invalid to valid, the output signal of latch circuit L30 experiences the meta stable state in which the output is not established for a prescribed time period. If the meta stable state appearing in the output signal of latch circuit L30 should propagate to the internal UCI20, there would be a malfunction.

Therefore, as a means for avoiding the meta stable state, asynchronous transfer circuit 30 is formed with a plurality of stages of latch circuits, as shown in FIG. 5. By way of example, in the present embodiment, three stages of latch circuits L30 to L32 are provided. Latch circuits L30 and L32 latch the input signal in response to the internal clock signal P2, while latch circuit L31 latches the input signal in response to the internal clock signal P1. Latch circuit L31 is identical with latch circuit L30 shown in FIG. 6, with the input signal changed from internal clock signal P2 to P1.

The external control signal input to asynchronous transfer circuit 30 is latched by the first latch circuit L30 in response to the fall of internal clock signal P2, and output to the second latch circuit L31. The second latch circuit L31 takes in the external control signal ORQSSPND in response to the rise to H level of the internal clock signal P1 at the timing after period t5 elapsed from the fall of the internal clock signal P2. The second latch circuit L31 latches the external control signal ORQSSPND in response to the fall of the internal clock signal P1, and outputs the same to the third latch circuit L32. The third latch circuit L32 takes in the external control signal ORQSSPND in response to the rise of the internal clock signal P2 at the timing after period t4 elapsed from the fall of the internal clock signal P1, and latches and outputs the external control signal ORQSSPND in response to the fall of the internal clock signal P2.

Specifically, the external control signal ORQSSPND is delayed by one clock of internal clock signal P2, than when it is latched by one latch circuit L30. In the first latch circuit L30, an asynchronous input may possibly cause the meta stable. The duration of meta stable, however, is generally shorter than one clock, and therefore, while the data is transmitted from the first latch circuit L30 to the third latch circuit L32, the data logic will surely be established, and therefore, the third latch circuit L32 is free from any influence of meta stable state. Thus, the third latch circuit latches the external control signal ORQSSPND of which logic has been established as valid/invalid. Because of this configuration, a stable signal can be transferred to the succeeding internal CUI 20.

FIG. 8 is a timing chart illustrating the operation of the semiconductor memory device in accordance with the second embodiment. In the following, an example will be described in which an erase operation takes place in the flash memory, in response to the write command buffer signal TXLWE.

In external clock generating circuit 40, external clock signals T1, T1_D, T2 and T2_O are generated, using the write command buffer signal TXLWE as a trigger. As described with the first embodiment, external clock signal T1 will be a signal synchronized with the write command buffer signal TXLWE, when the mode indicating signal RDY is at the "H" level. External clock signal T1_D is a signal that is constantly synchronized with the write command buffer signal TXLWE, regardless of the mode indicating signal RDY, as shown in FIG. 8.

Next, the mode indicating signal RDY makes a transition from the "H" level indicating the "READY" state to the "L" level indicating the "BUSY" state, in response to the semiconductor memory device entering the internal operation mode.

In response to the mode indicating signal RDY attaining to the "L" level, external clock signal T1 is fixed at the "L" level in external clock generating circuit 40. Consequently, external CUI 10 is set to a state in which reception of any external command is prohibited. At this time, the suspend command, which is the only command that must be received in the internal operation mode, can be received by latch circuit L10 for suspension only, arranged in external CUI 10.

Here, as shown in FIG. 8, assume that a suspend command B0 is input during the "BUSY" period, to the data input IOD [7:0] of latch circuit L10 for suspension only.

Suspend command B0 is latched by latch circuit L10 for suspension only, in response to external clock signal T1_D. Further, the latched suspend command B0 is decoded by combinatorial logic (CL) circuit 11. The decoded suspend command hrq-sspnd is converted to a one-shot pulse external control signal ORQSSPND synchronized with external clock signal T2_0, in AND circuit G10.

Further, external control signal ORQSSPND is transmitted to asynchronous transfer circuit 30. In asynchronous transfer circuit 30, external control signal ORQSSPND is converted by asynchronous RS-type flip-flop 32 and three stages of latch circuits L30 to L32, to an internal system signal HRQSSPND, and transmitted to internal CUI 20.

Internal CUI 20 generates the internal control signal by a combinatorial logic (CL) circuit provided therein, and suspends the operation of memory circuit 60 by the internal control signal. Further, in response to the memory circuit 60 entering the suspended state, internal CUI 20 generates an activated internal control signal HSSPND.

Internal control signal HSSPND is transmitted to mode indicating signal generating unit 35. Internal control signal HSSPND is passed through asynchronous RS-type flip-flop 33 to be the signal XHSSPND, and input to OR circuit G30. OR circuit G30 outputs, in response to the XHSSPND signal at the "H" level, mode indicating signal RDY activated to the "H" level.

When mode indicating signal RDY is activated to the "H" level, external clock generating circuit 40 generates external clock signal T1 in synchronization with the fall of write command buffer signal TXLWE. When external clock signal T1 is supplied, external CUI 10 is allowed to receive external commands again.

As described above, in order to avoid the meta stable state, a plurality of stages of latch circuits L30 to L32 are used, and therefore, stable signal transfer between the external system circuit and the internal system circuit becomes possible. Further, after the internal circuit is suspended, reception of an external command is allowed by the external clock signal T1 that is generated in response to the mode indicating signal RDY, and the operation of the external system circuit becomes possible.

As described above, according to the second embodiment of the present invention, when the semiconductor memory device is in the internal operation mode, reception of external commands is prohibited, and malfunction can be suppressed.

The suspend command, which is the only command that must be received in the internal operation period, can always be received, as a latch circuit used only for that purpose is provided and the command is latched in response to an external clock signal operating independent from the operation mode.

Further, when control signals are transferred between external and internal system circuits that are not synchronized with each other, data is taken by a plurality of stages of latch circuits, so that generation of the meta stable state can be prevented and stable operation is ensured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
an external clock generating circuit generating an external clock signal in synchronization with a clock signal from outside the device;
an external control signal generating circuit taking an external command applied from outside the device in synchronization with said external clock and generating an external control signal in response to said taken external command;
a memory circuit including a memory cell array and a read/write circuit reading data from and writing data to said memory cell array;
an internal control signal generating circuit taking said external control signal in synchronization with an internal clock signal asynchronous with said external clock signal, and generating an internal control signal controlling said memory circuit in response to said taken external control signal;
a mode indicating signal generating unit generating a mode indicating signal that attains to a first logic state in response to said memory circuit entering an internal operation mode and to a second logic state in response to an end of the internal operation mode; and
an internal clock generating circuit generating said internal clock signal in response to said mode indicating signal at said second logic state; wherein
said external clock signal generating circuit stops generation of said external clock signal in response to said mode indicating signal at said first logic state, and generates said external clock signal, based on a first signal generated based on said mode indicating signal at said second logic state and said clock signal from outside the device and on a second signal provided by delaying said clock signal from outside the device by a prescribed amount of delay.

2. The semiconductor memory device according to claim 1, wherein
said external clock generating circuit includes
a phase comparator comparing a phase of said clock signal from outside the device and a phase of said mode indicating signal, and outputting said first signal as a result of phase comparison,
a delay circuit generating said second signal by delaying said clock signal from outside the device by said prescribed amount of delay, and
a logic circuit receiving as inputs said first signal and said second signal, and outputting said external clock signal.

3. A semiconductor memory device, comprising:
an external clock generating circuit generating an external clock signal in synchronization with a clock signal from outside the device;
an external control signal generating circuit taking an external command applied from outside the device in synchronization with said external clock and generating an external control signal in response to said taken external command;
a memory circuit including a memory cell array and a read/write circuit reading data from and writing data to said memory cell array;
an internal control signal generating circuit taking said external control signal in synchronization with an internal clock signal asynchronous with said external clock signal, and generating an internal control signal controlling said memory circuit in response to said taken external control signal;
a mode indicating signal generating unit generating a mode indicating signal that attains to a first logic state in response to said memory circuit entering an internal operation mode and to a second logic state in response to an end of the internal operation mode; and
an internal clock generating circuit generating said internal clock signal in response to said mode indicating signal at said second logic state; wherein
said internal control signal generating circuit outputs a reset pulse signal for initializing said external control signal generating circuit, in response to said memory circuit ending the internal operation;
said mode indicating signal generating unit generates said mode indicating signal at the second logic state, in response to completion of initialization of said external control signal generating circuit by said reset pulse signal; and
said external clock signal generating circuit delays said mode indicating signal input from said mode indicating signal generating unit such that time for transition from said second logic state to said first logic state is delayed than time for transition from said first logic state to said second logic state, stops generation of said external clock signal in response to said mode indicating signal at said first logic state and generates said external clock signal in response to said mode indicating signal at said second logic state.

4. The semiconductor memory device according to claim 3, wherein
time of said delay is shorter than width of said reset pulse signal.

5. A semiconductor memory device, comprising:
an external clock generating circuit generating an external clock signal in synchronization with a clock signal from outside the device;
an external control signal generating circuit taking an external command applied from outside the device in synchronization with said external clock and generating an external control signal in response to said taken external command;

a memory circuit including a memory cell array and a read/write circuit reading data from and writing data to said memory cell array;

an internal control signal generating circuit taking said external control signal in synchronization with an internal clock signal asynchronous with said external clock signal, and generating an internal control signal controlling said memory circuit in response to said taken external control signal;

a mode indicating signal generating unit generating a mode indicating signal that attains to a first logic state in response to said memory circuit entering an internal operation mode and to a second logic state in response to an end of the internal operation mode; and an internal clock generating circuit generating said internal clock signal in response to said mode indicating signal at said second logic state; wherein said external clock generating circuit includes an external clock signal generating unit receiving said mode indicating signal and executing/stopping generation of said external clock signal, and a second external clock signal generating unit generating a second external clock signal in synchronization with said clock signal from outside the device, independent from said mode indicating signal;

said external control signal generating circuit includes a latch circuit holding a suspend command suspending said internal operation mode, and a combinatorial logic circuit generating said external control signal suspending said memory circuit, in response to said latched suspend command; and said latch circuit latches said suspend command in response to said second external clock signal.

6. The semiconductor memory device according to claim 5, further comprising an asynchronous transfer circuit arranged between said external control signal generating circuit and said internal control signal generating circuit, for transferring said internal control signal and said external control signal not synchronized with each other, to said external control signal generating circuit and said internal control signal generating circuit, respectively; wherein said asynchronous transfer circuit includes a plurality of stages of latch circuits, each latching said external control signal in response to said internal clock signal.

* * * * *